(12) United States Patent
Fujibayashi et al.

(10) Patent No.: US 12,252,791 B2
(45) Date of Patent: Mar. 18, 2025

(54) APPARATUS FOR MANUFACTURING SEMICONDUCTOR DEVICE

(71) Applicant: DENSO CORPORATION, Kariya (JP)

(72) Inventors: Hiroaki Fujibayashi, Kariya (JP); Yuya Koide, Kariya (JP); Hirotaka Mori, Nissin (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/668,853

(22) Filed: Feb. 10, 2022

(65) Prior Publication Data
US 2022/0259739 A1 Aug. 18, 2022

(30) Foreign Application Priority Data

Feb. 16, 2021 (JP) ................................ 2021-022686

(51) Int. Cl.
*C23C 16/52* (2006.01)
*C23C 16/458* (2006.01)
*G03F 7/16* (2006.01)

(52) U.S. Cl.
CPC .......... *C23C 16/52* (2013.01); *C23C 16/4584* (2013.01); *G03F 7/162* (2013.01)

(58) Field of Classification Search
CPC ..... C23C 16/4584; C23C 16/52; G03F 7/162; B05C 11/08; H01L 21/02282; H01L 2224/03416; H01L 2224/11416; H01L 2224/27416; H01L 2224/75181; H01L 2224/77181; H01L 2224/79181
See application file for complete search history.

(56) References Cited

U.S. PATENT DOCUMENTS

| | | | |
|---|---|---|---|
| 6,492,625 B1* | 12/2002 | Boguslavskiy | ... H01L 21/68764 219/486 |
| 2003/0061989 A1* | 4/2003 | Kamimura | .............. C23C 16/52 118/712 |
| 2006/0150903 A1* | 7/2006 | Zuger | ................... C23C 14/547 427/248.1 |
| 2007/0072398 A1 | 3/2007 | Shibata et al. | |
| 2012/0307233 A1* | 12/2012 | Boguslavskiy | ... H01L 21/67109 356/43 |
| 2015/0376782 A1* | 12/2015 | Griffin | .............. C23C 16/45544 118/712 |

FOREIGN PATENT DOCUMENTS

JP H04-119631 A 4/1992

* cited by examiner

*Primary Examiner* — Dah-Wei D. Yuan
*Assistant Examiner* — Stephen A Kitt
(74) *Attorney, Agent, or Firm* — Posz Law Group, PLC

(57) ABSTRACT

An apparatus manufactures a semiconductor device. The apparatus includes a film formation device, a first detector and a second detector. The film formation device forms an embedded layer for embedding a trench disposed at a substrate in the semiconductor device. The first detector detects a state of a first region of the substrate where the trench is disposed. The second detector detects a state of a second region of the substrate, the second region disposed outside of the first region. The film formation device ends film formation of the embedded layer, based on a condition that difference between a first detection result corresponding to the state of the first region and a second detection result corresponding to the state of the second region is smaller than or equal to a threshold value.

22 Claims, 12 Drawing Sheets

APPARATUS FOR MANUFACTURING SEMICONDUCTOR DEVICE

CROSS REFERENCE TO RELATED APPLICATION

This application is based on Japanese Patent Application No. 2021-022686 filed on Feb. 16, 2021, the disclosure of which is incorporated herein by reference.

TECHNICAL FIELD

The present disclosure relates to an apparatus for manufacturing a semiconductor device.

BACKGROUND

In manufacturing of a semiconductor device, a trench formed at a substrate is embedded. In embedding of the trench, it may be desirable that a surface of the substrate after embedding of the trench has a flat shape with few irregularities in order to perform a subsequent process such as ion implantation with precision.

SUMMARY

The present disclosure describes an apparatus for manufacturing a semiconductor device to form an embedded layer for embedding a trench formed at a substrate, and further describes the apparatus including a film formation device, a first detector and a second detector.

BRIEF DESCRIPTION OF THE DRAWINGS

The objects, features and advantages of the present disclosure will become more apparent from the following detailed description made with reference to the accompanying drawings. In the drawings.

DETAILED DESCRIPTION

Figure 1:
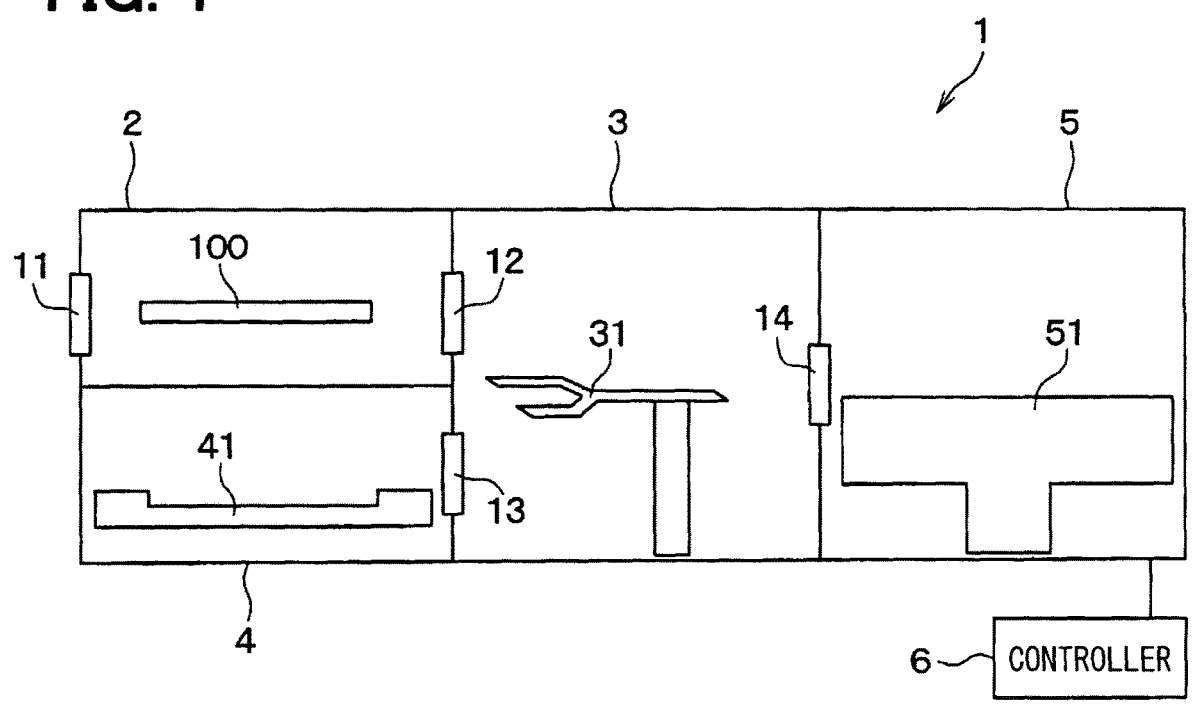
FIG. 1 illustrates the entire configuration of an apparatus for manufacturing a semiconductor device in a first embodiment.

In order to shorten a processing time in manufacturing of a semiconductor device, it may be desirable to end a film formation process for an embedded layer at an earlier time as soon as embedding of a trench is completed. In order to flatten the surface of a substrate and shorten the processing time, it may be necessary to detect the end of the embedding with better precision.

During the growth of an epitaxial film for embedding the trench, a surface temperature of the epitaxial film may be detected by a pyrometer and the end of embedding may be detected based on no variation in an output level of the pyrometer.

However, the above method may not quantitatively detect the time at which the output level of the pyrometer has not been changed.

As a method of detecting that the output level of the pyrometer has not been changed, for example, it may be determined that the output level of the pyrometer has not been changed, based on a condition that the variation amount of the output level smaller than or equal to a threshold value has been elapsed for a predetermined time. In such a method, even though the output level does not actually change, the film formation process is still continued until a predetermined time has been elapsed. Therefore, the processing time may take longer.

As described above, it may be required to detect the end of embedding the trench quantitatively to flatten the surface of the substrate after embedding, and to further shorten the processing time.

According to an aspect of the present disclosure, an apparatus manufactures a semiconductor device. The apparatus includes a film formation device, a first detector and a second detector. The film formation device forms an embedded layer for embedding a trench disposed at a substrate in the semiconductor device. The first detector detects a state of a first region of the substrate where the trench is disposed. The second detector detects a state of a second region of the substrate, the second region disposed outside of the first region. The film formation device ends film formation of the embedded layer, based on a condition that difference between a first detection result corresponding to the state of the first region and a second detection result corresponding to the state of the second region is smaller than or equal to a threshold value.

When the embedding of the trench is completed, the state such as color or temperature of the first region becomes nearly equal to the state of the second region. The trench is formed at the first region, and the second region is located outside of the first region. It is possible to quantitatively detect the end of the embedding by comparing the state of the first region with the state of the second region. In other words, in a case where the difference between the detection result of the first detector and the detection result of the second detector is compared with the threshold value, it is possible to set a time point at which the difference is smaller than or equal to the threshold value, as an end time of the embedding. Subsequently, by ending the film formation at this time point, it is possible to flatten the surface of the substrate after embedding, and to shorten the processing time.

In the following, embodiments of the present disclosure will be described with reference to the drawings. In the embodiments described hereinafter, the same or equivalent parts will be designated with the same reference numerals.

First Embodiment

The following describes a first embodiment. A manufacturing apparatus 1 according to a first embodiment illustrated in FIG. 1 is an apparatus for manufacturing a semiconductor device. In the manufacturing apparatus for etching, an embedded film for embedding a trench is formed at a wafer-shaped semiconductor substrate where the trench is formed. The manufacturing apparatus 1 includes a load-lock chamber 2, a transport chamber 3, a susceptor chamber 4, a reactor 5 and a controller 6.

Figure 2:
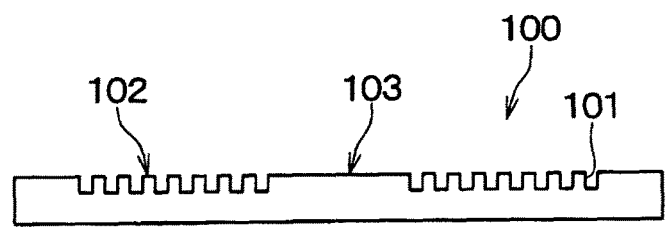
FIG. 2 illustrates a cross sectional view of a wafer at which a trench is formed.

The load-lock chamber 2 is a chamber for transporting a wafer 100 into the manufacturing apparatus 100 from outside of the manufacturing apparatus 1. The load-lock chamber 2 is formed with a communication passage communicating with the outside of the manufacturing apparatus 1. As illustrated in FIG. 2, the wafer 100 has a first region 102 and a second region 103. The first region 102 is a portion of the wafer 100 where a trench 101 is formed. The second region 103 is a flat portion of the wafer 100 outside of the first region 102 where the trench 101 is not formed. The wafer 100 is transported into the load-lock chamber 2 through the above communication passage after multiple trenches 101 are formed by the manufacturing device (not shown).

The load-lock chamber 2 communicates with the transport chamber 3. The wafer 100 transported from outside of the manufacturing apparatus 1 to the load-lock chamber 2 is transported to the transport chamber 3 after performing a predetermined treatment at the load-lock chamber 2.

As illustrated in FIG. 1, the communication passage between the load-lock chamber 2 and the outside of the manufacturing apparatus 1 is provided with a gate valve 11. The communication passage between the load-lock chamber 2 and the transport chamber 3 is provided with a gate valve 12. When the wafer 100 is transported into the load-lock chamber 2, the gate valve 11 and the gate valve 12 are closed and evacuated by a pump (not shown), a gas is supplied by a gas line (not shown), and the pressure in the load-chamber 2 is adjusted to have a pressure identical to the pressure in the transport chamber 3. Subsequently, the gate valve 12 is opened, and the wafer 100 is transported into the transport chamber 3.

The transport chamber 3 is a chamber for transporting the wafer 100 between the load-lock chamber 2 and the reactor 5 and between the susceptor chamber 4 and the reactor 5. The transport chamber 3 communicates with the load-lock chamber 2, and also communicates with the susceptor chamber 4 and the reactor 5. The transport chamber 3 is adjusted to a predetermined pressure by the gas supplied by a pump or the gas line (not shown). A transporter 31 is provided inside the transport chamber 3.

The transporter 31 transports the wafer 100 and a susceptor 41 described hereinafter. The transport of the wafer 100 and the susceptor 41 between the load-lock chamber 2 and the transport chamber 3, between the transport chamber 3 and the susceptor chamber 4, and between the transport chamber 3 and the reactor 5 is executed by the transporter 31. The transporter 31 includes, for example, a robot arm provided with a hand portion for gripping an object, for example, the wafer 100.

The communication passage between the transport chamber 3 and the susceptor chamber 4 is provided with a gate valve 13. The gate valve 13 is opened when the wafer 100 or the like is transported between the transport chamber 3 and the susceptor chamber 4. The communication passage between the transport chamber 3 and the reactor 5 is provided with a gate valve 14. The gate valve 14 is opened when the wafer 100 or the like is transported between the transport chamber 3 and the reactor 5. The wafer 100 is taken out from the load-lock chamber 2 to the transport chamber 3 by the transporter 31, and then is transported to the susceptor chamber 4.

The susceptor chamber 4 is a chamber for placing the wafer 100 on the susceptor 41. The susceptor 41 holds the wafer 100 when a process such as a film formation process is executed on the wafer 100. The susceptor 41 has a disk shape. A recess is formed at a top surface of the susceptor 41, and the wafer 100 is placed at the recess. The susceptor 41 at which the wafer 100 is placed is taken out to the transport chamber 3 from the susceptor chamber 4 through the transporter 31, and is subsequently transported to the reactor 5.

Figure 3:
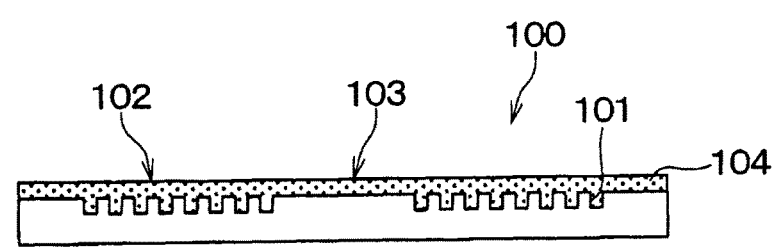
FIG. 3 illustrates a cross sectional view of a wafer at which an embedded layer is formed.
Figure 4:
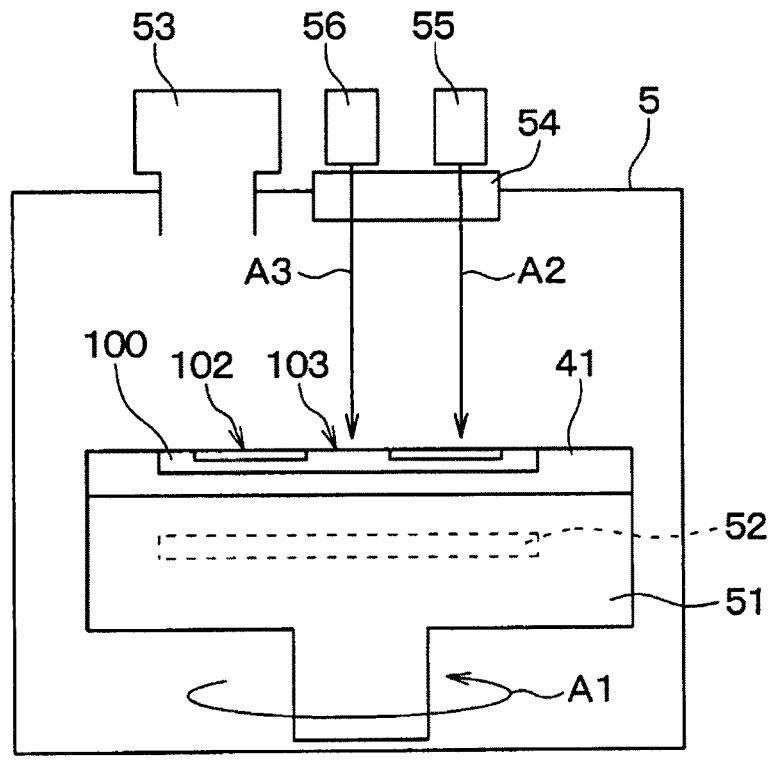
FIG. 4 illustrates the configuration of a reactor illustrated in FIG. 1.

The reactor 5 is a chamber for executing the film formation process on the wafer 100. In the reactor 5, as illustrated in FIG. 3, an embedded layer 104 for embedding the trench 101 at the wafer 100 is formed. As illustrated in FIG. 4, the reactor 5 is provided with a table 51, a temperature adjuster 52, a film formation device 53, a quartz window 54, a temperature detector 55 and a temperature detector 56. The temperature detector 55 may also be referred to as a first temperature detector, and the temperature detector 56 may also be referred to as a second temperature detector. FIG. 4 illustrates the susceptor 41 is placed at the table 51.

The table 51 is for mounting the susceptor 41. As shown by an arrow A1, the table 51 rotates about an axis perpendicular to the mounting surface. The mounting surface may also be referred to as a placement surface. When the table 51 rotates, the susceptor 41 and the wafer 100 above the table 51 rotates around the axis perpendicular to the mounting surface of the table 51. In the reactor 5, the embedded layer 104 is formed in a state where the wafer 100 rotates as described above.

The temperature adjuster 52 adjusts the temperature of the susceptor 41 and the temperature of the wafer 100. The temperature adjuster 52 includes, for example, a heater provided inside the table 51. When the table 51 is heated by the temperature adjuster 52, the respective temperatures of the susceptor 41 and the wafer 100 placed on the table 51 are adjusted. The temperature adjuster 52 adjusts the temperature of the susceptor 41 and the temperature of the wafer 100 so that the temperature of the second region 103 is constant.

Two openings are formed at the ceiling of the reactor 5. The film formation device 53 is arranged at one of the two openings, and the other one of the two openings is closed by the quartz window 54.

The film formation device 53 supplies a source gas of Chemical Vapor Deposition (CVD) to the inside of the reactor 5, and is arranged to blow the source gas from the opening at the ceiling of the reactor 5. When the source gas is supplied by the film formation device 53, the trench 101 is embedded and the embedded layer 104 is formed through the chemical reaction between the surface of the wafer 100 and the source gas. The wafer 100 is heated by the temperature adjuster 52.

The temperature detector 55 and the temperature detector 56 are arranged at the top part of the quartz window 54. The temperature detector 55 and the temperature detector 56 respectively detect the temperature of the wafer 10. Each of the temperature detector 55 and the temperature detector 56 includes, for example, a pyrometer. As shown by arrows A2, A3, the temperature detector 55 and the temperature detector 56 respectively detect the temperature of a portion of the wafer 100 below the temperature detector 55 and the temperature detector 56.

In the present embodiment, the second region 103 is a region including a central portion of the wafer 100, and the first region 102 is formed at the outer peripheral portion of the second region 103 of the central portion of the wafer 100. The temperature detector 55 is arranged above the outer peripheral portion of the wafer 100, and the temperature detector 56 is arranged above the central portion of the wafer 100. As a result, the temperature of the first region 102 is detected by the temperature detector 55, and the temperature of the second region 103 is detected by the temperature detector 56.

As described above, the temperature detector 55 and the temperature detector 56 respectively detect the state of the first region 102 and the state of the second region 103. The temperature detector 55 corresponds to a first detector, and the temperature detector 56 corresponds to a second detector.

The controller 6 controls, for example, the transporter 31, the table 51, the film formation device 53, the gate valves 11 to 14, and the pump (not shown) to execute the transport of the wafer 100 and the film formation process on the wafer 100. The controller 6 operates the film formation device 53 based on the detection results of the temperature detector 55 and the temperature detector 56, and executes the film formation process on the wafer 100.

The controller 6 is connected to, for example, the transporter 31, the table 51, the temperature adjuster 52 and the film formation device 53. When the controller 6 operates the transporter 31 to place the susceptor 41 on the table 51 is rotated by operating a driver (not shown). The wafer 100 is placed at the susceptor 41. The controller 6 operates the temperature adjuster 52 to heat the susceptor 41 and the wafer 100. In addition, the controller 6 operates the film formation device 53 to supply the source gas into the reactor 5, and executes the film formation on the wafer 100. The detection result of the temperature detector 55 and the detection result of the temperature detector 56 are transmitted to the controller 6. When the difference in the temperatures respectively detected by the temperature detector 55 and the temperature detector 56 is larger than a predetermined threshold value, the controller 6 continues the film formation process. When the difference in the temperatures respectively detected by the temperature detector 55 and the temperature detector 56 is smaller than or equal to the threshold value, the controller 6 ends the film formation process.

The controller 6 includes a microcomputer having a CPU, ROM, RAM, non-volatile rewritable memory, etc. (not shown). The non-volatile rewritable memory is, for example, EEPROM or flash ROM. EEPROM is an abbreviation of Electronically Erasable and Programmable Read Only Memory. The controller 6 operates, for example, the film formation device 53 according to the program stored in a built-in memory to execute the film formation process on the wafer 10.

Figure 5:
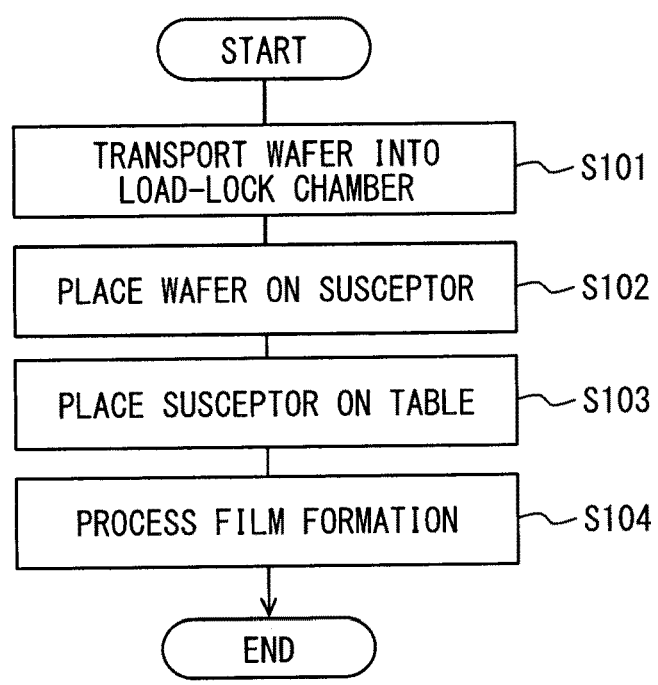
FIG. 5 is a flowchart showing a manufacturing process of the semiconductor device in the first embodiment.

The following describes the operation of the manufacturing apparatus 1. The manufacturing apparatus 1 executes S101 to S104 shown in FIG. 5 in order to form the embedded layer 104 for embedding the trench 101 at the wafer 100.

In S101, the wafer 100 at which the trench 101 is formed by the manufacturing device for etching (not shown) is transported in to the load-lock chamber 2. As the wafer 100 is transported, the controller 6 closes the gate valve 11 and the gate valve 12, and operates the pump (not shown) to evacuate the load-lock chamber 2, and supplies the gas to the load-lock chamber 2 from the gas line (not shown). As a result, the load-lock chamber 2 is adjusted to have the pressure identical to the pressure in the transport chamber 3.

In S102, the controller 6 opens the gate valve 12, and operates the transporter 31 to transport the wafer 100 to the transport chamber 3. Subsequently, the controller 6 opens the gate valve 13 to transport the wafer 100 to the susceptor chamber 4, and places the wafer 100 above the susceptor 41.

In S103, the controller 6 operates the transporter 31 to transport the susceptor 41 on which the wafer 100 is placed to the transport chamber 3 in S102. The controller 6 opens the gate valve 14 to transport the susceptor 41 to the reactor 5, and places the susceptor 41 above the table 51. Subsequently, the controller 6 closes the gate valve 14.

In S104, the controller 6 executes the film formation process on the wafer 100. The controller 6 operates the driver (not shown) to rotate the table 51, and operates the temperature adjuster 52 to heat the wafer 100 held by the susceptor 41 above the table 51. The controller 6 operates the film formation device 53 to supply the source gas into the reactor 5. As a result, the embedded layer 104 is formed at the wafer 100.

During the formation of the embedded layer 104, the temperature detector 55 detects the temperature of the first region 102 and the temperature detector 56 detects the temperature of the second region 103, and the detection results are transmitted to the controller 6. The controller 6 operates the temperature adjuster 52 so that the temperature of the second region 103 detected by the temperature detector 56 becomes constant at a preset value.

When the difference in the temperatures respectively detected by the temperature detector 55 and the temperature detector 56 is larger than a predetermined threshold value, the controller 6 continues the film formation process for the embedded layer 104. When the difference in the temperatures respectively detected by the temperature detector 55 and the temperature detector 56 is smaller than or equal to the threshold value, the controller 6 ends the film formation process.

When the film formation process ends, the controller 6 operates the transporter 31 to transport the susceptor 41 to the susceptor chamber 4 from the reactor 5. The controller 6 transports the wafer 100 removed from the susceptor 41 to the load-lock chamber 2 through the transporter 31. The wafer 100 transported to the load-lock chamber 2 is transported out to a manufacturing device (not shown) for a subsequent process.

Figure 6:
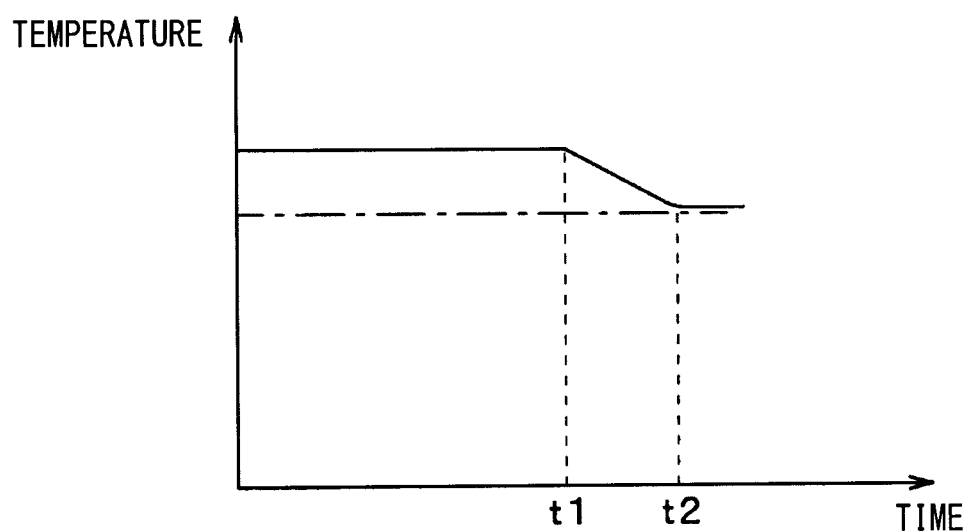
FIG. 6 illustrates the temperature of a first region and the temperature of a second region during a film formation process.
Figure 7:
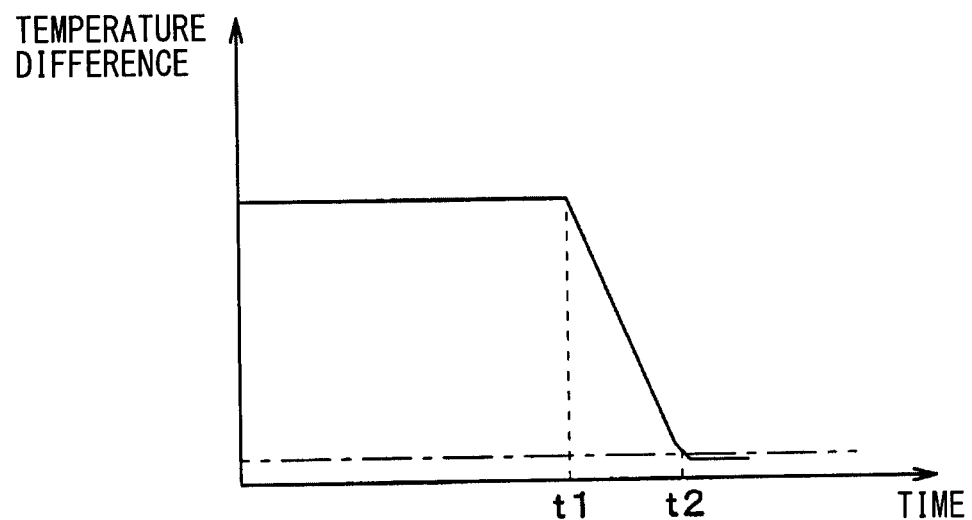
FIG. 7 illustrates the difference between the temperature of the first region and the temperature of the second region during a film formation process.
Figure 8:
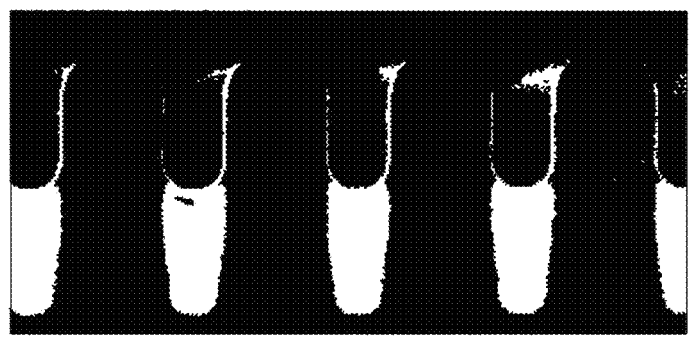
FIG. 8 illustrates an image of a cross section view of the wafer at a time prior to time t1 in FIG. 6.
Figure 9:
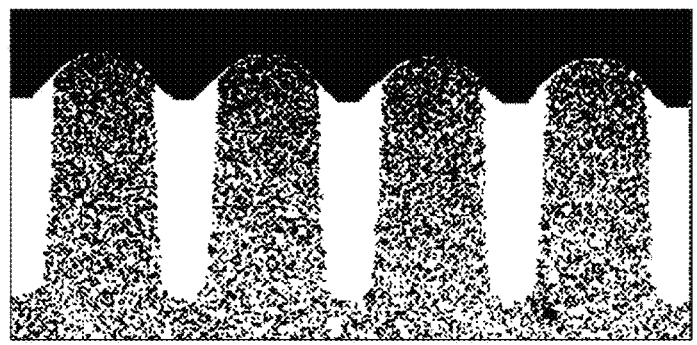
FIG. 9 illustrates an image of the cross section view of the wafer at a time subsequent to time t1 and prior to time t2 in FIG. 6.
Figure 10:
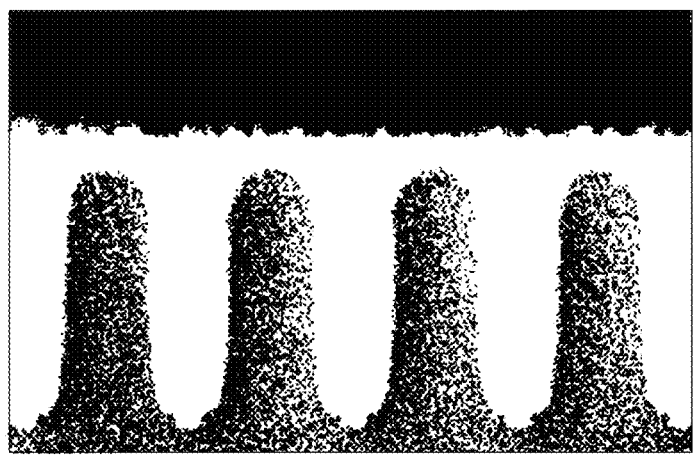
FIG. 10 illustrates an image of the cross section view of the wafer at a time subsequent to time t2 in FIG. 6.

The following describes the advantageous effects attained in the present embodiment. During the execution of the film formation process, the temperature of the wafer 100 varies as illustrated in FIGS. 6, 7. The solid line in FIG. 6 indicates the temperature of the first region 102, and the one-dot-chain line in FIG. 6 indicates the temperature of the second region 103. The solid line in FIG. 7 indicates the temperature difference between the first region 102 and the second region 103. The horizontal axis in each of FIGS. 6, 7 is the time from the start of the film formation. Each of FIGS. 8 to 10 is an image of the cross section of the wafer 100 during the film formation process. In each of FIGS. 8 to 10, the lower black portion is the wafer 100 formed with the trench 101, and the white portion is the embedded layer 104. FIG. 8 is an image of the cross section of the wafer 100 at a time prior to time t1 in FIG. 1. FIG. 9 is an image of the cross section of the wafer 100 at a time subsequent to time t1 and prior to time t2. FIG. 10 is an image of the cross section of the wafer 100 at a time subsequent to time t2.

During the film formation process, the temperature of the second region 103 is maintained constant. The temperature of the first region 102 varies with time as illustrated in FIG. 6.

At the time immediately after the start of the film formation of the embedded layer 104 as shown in FIG. 8, the temperature of the first region 102 is substantially constant at a temperature higher than the temperature of the second region 103. As a result, the temperature difference between the first region 102 and the second region 103 is substantially constant at a value larger than a value indicated by the one-dotted-chain line in FIG. 7.

When the film formation as shown in FIG. 9 progresses, the temperature of the first region 102 decreases with the elapse of time. As a result, the temperature difference between the first region 102 and the second region 103 decreases with the elapse of time as shown in FIG. 7.

When the film formation further progresses and the trench 101 is completely embedded as shown in FIG. 10, the temperature of the first region 102 is constant at a value substantially equal to the temperature of the second region 103. As a result, the temperature difference between the first region 102 and the second region 103 is substantially constant at a value smaller than the value indicated by the one-dotted-chain line.

When the value indicated by the one-dotted-chain line is set as a threshold value to be compared with the temperature difference, it is possible to detect the time of the end of the embedding of the trench 101 with enhanced precision. By ending the film formation process at that time, it is possible to flatten the surface of the wafer 100 after the film formation and shorten the film formation time.

When the embedding of the trench 101 is ended, the temperature of the first region 102 formed with the trench 101 and the temperature of the second region 103 outside the first region 102 are nearly equal. As comparing the temperature of the first region 102 with the temperature of the second region 103 as in the present embodiment, it is possible to detect the end of embedding quantitatively. In the present embodiment, as the difference between the detection result of the temperature detector 55 and the detection result of the temperature detector 56 is compared with the threshold value, the film formation process for the embedded layer 104 is ended at a time when the difference is smaller than or equal to the threshold value as the end of the embedding. Therefore, it is possible to flatten the surface of the wafer 100 after embedding and shorten the film formation time.

According to the above embodiment, it is possible to attain the following advantageous effects.

The second region 103 for referring to the temperature is a region including the central portion of the wafer 100. Therefore, it is possible to set a wide region over the entire outer peripheral portion of the wafer 100 as the first region 102, and the effective area becomes larger.

Second Embodiment

The following describes a second embodiment. The present embodiment is different from the first embodiment in the configuration of the first and second detectors, and the other parts are similar to the first embodiment. Therefore, the following only describes the parts different from the first embodiment.

Figure 11:
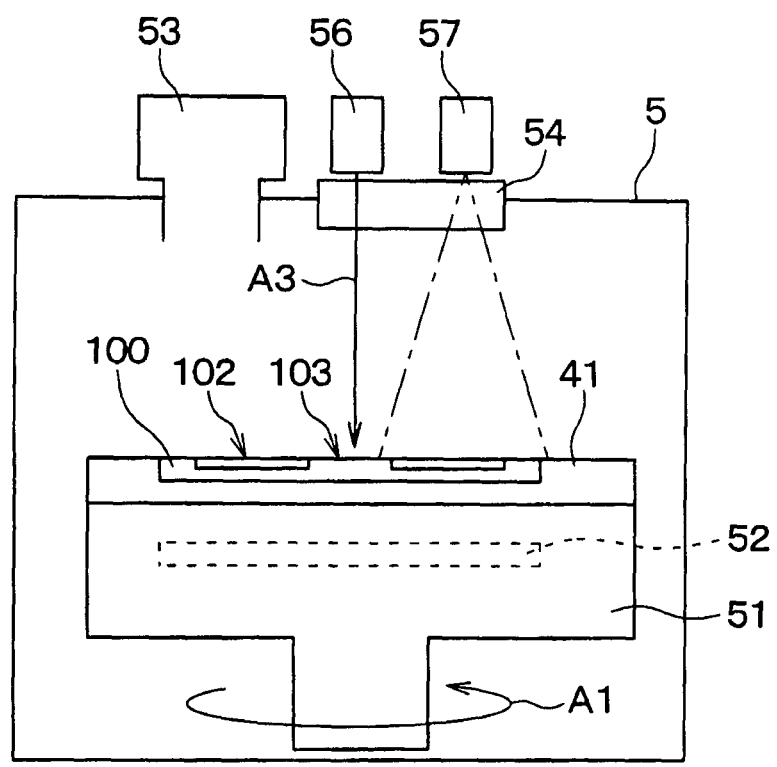
FIG. 11 illustrates the configuration of a reactor in a second embodiment.

As shown in FIG. 11, in the present embodiment, the temperature detector 55 is not arranged at the reactor 5; however, an image pickup device 57 is arranged at the reactor 5. The image pickup device 57 may also be referred to as an image sensor. The image pickup device 57 captures an image of the wafer 100 during the film formation, and the image captured by the image pickup device 57 is transmitted to the controller 6.

A one-dotted-chain line in FIG. 11 indicates an imaging range of the image pickup device 57. The image pickup device 57 is disposed at a top part of the quartz window 54 to capture an image of the first region 102 and the second region 103. As described above, the image pickup device 57 is disposed to detect the respective states of the first region 102 and the second region 103. The image pickup device 57 corresponds to the first detector and the second detector. The image pickup device 57 includes a camera having, for example, an image sensor such as a charge coupled device (CCD).

The image pickup device 57 captures an image of the rotating wafer 100 during the film formation. Therefore, it may be desirable to shorten the frame rate of the image pickup device 57 to some extent to reduce the blurring of the image captured by the image pickup device 57. For example, it may be desirable to shorten the frame rate of the image pickup device 57 than the rotation period of the wafer 100.

The following describes the operation of the manufacturing apparatus 1 according to the present embodiment. In the present embodiment, S101 to S103 are executed in the same manner as in the first embodiment. In S104, the controller 6 operates the temperature adjuster 52 to maintain the temperature of the second region 103 detected by the temperature detector 56 at a constant value in the same manner as in the first embodiment.

In the present embodiment, the controller 6 detects the end of embedding by adopting the gradation difference between the captured image of the first region 102 and the captured image of the second region 103, in replacement of the temperature difference between the first region 102 and the second region 103. The gradation difference refers to the difference between the gradation of the image of the first region 102 captured by the image pickup device 57 and the image of the second region 103 captured by the image pickup device 57. The controller 6 compares the gradation difference with a predetermined threshold value. When the gradation difference is larger than the threshold value, the controller 6 continues the film formation process. When the gradation difference is smaller than or equal to the threshold value, the controller 6 ends the film formation process.

Figure 12:
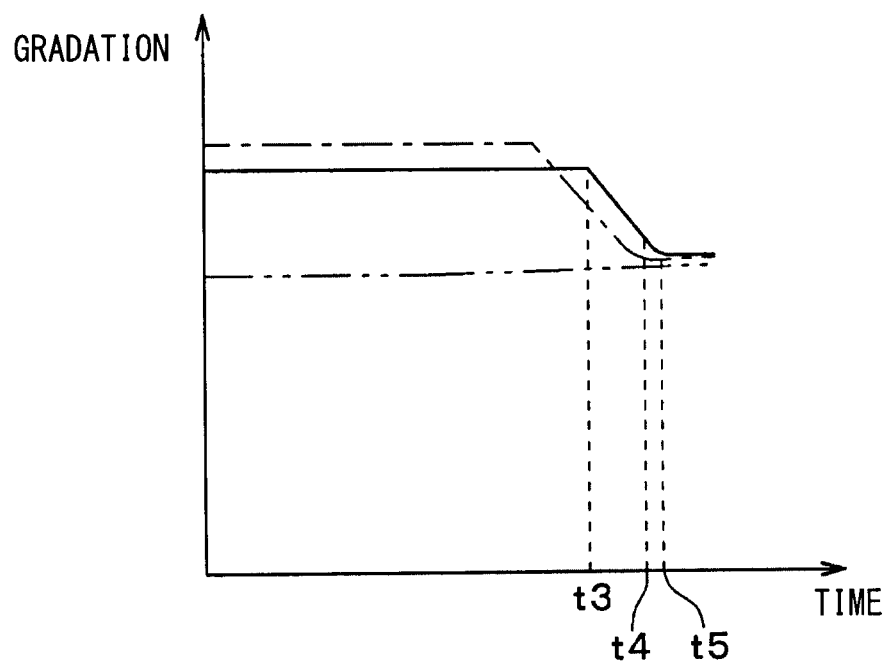
FIG. 12 illustrates the gradation of the image captured in the first region and the gradation of the image captured in the second region during the film formation process.
Figure 13:
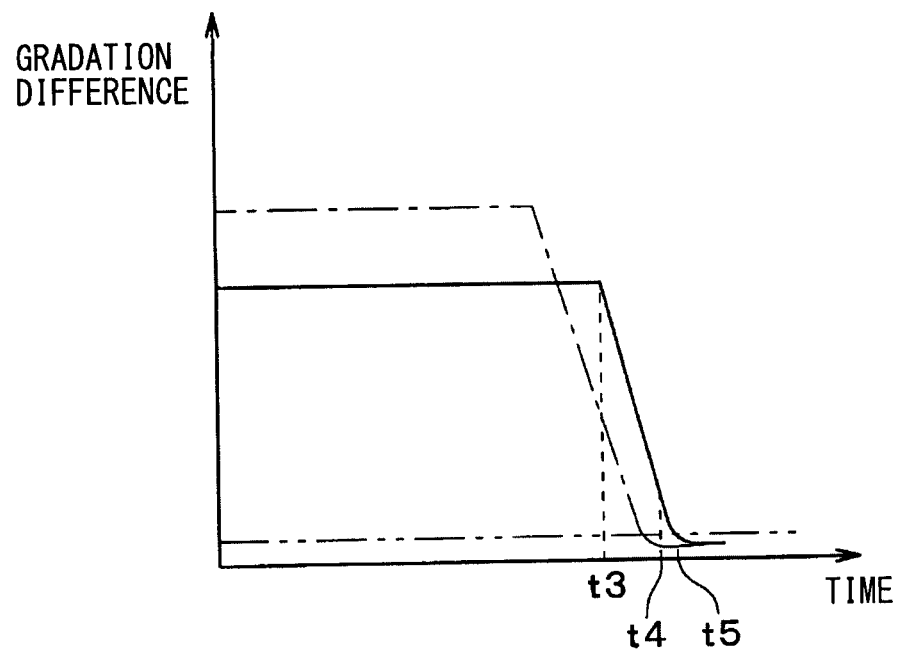
FIG. 13 illustrates the difference between the gradation of the image captured in the first region and the gradation of the image captured in the second region during the film formation process.

The following describes the advantageous effects attained in the present embodiment. During the execution of the film formation process, the gradation of the captured image of the wafer 100 varies as shown in FIGS. 12, 13. The horizontal axis in each of FIGS. 12, 13 is the time from the start of the film formation.

Figure 14:
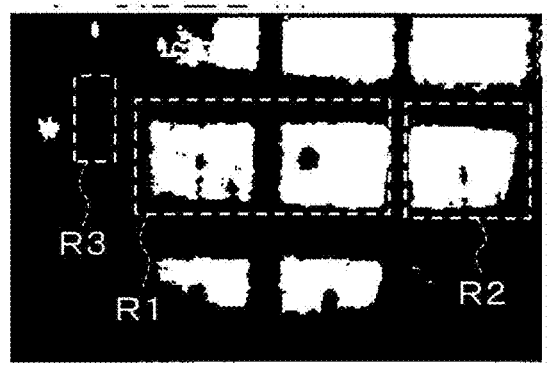
FIG. 14 illustrates an image of the wafer captured at a time prior to time t3 in FIG. 12.
Figure 15:
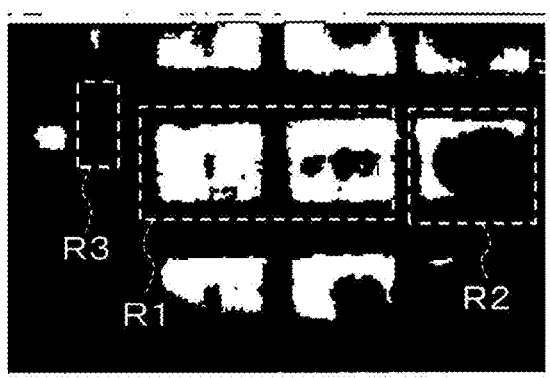
FIG. 15 illustrates an image of the wafer captured at a time subsequent to time t3 and prior to time t4 in FIG. 12.
Figure 16:
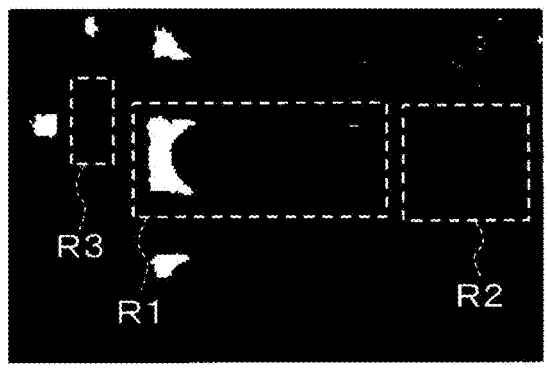
FIG. 16 illustrates an image of the wafer captured at a time subsequent to time t4 and prior to time t5 in FIG. 12.
Figure 17:
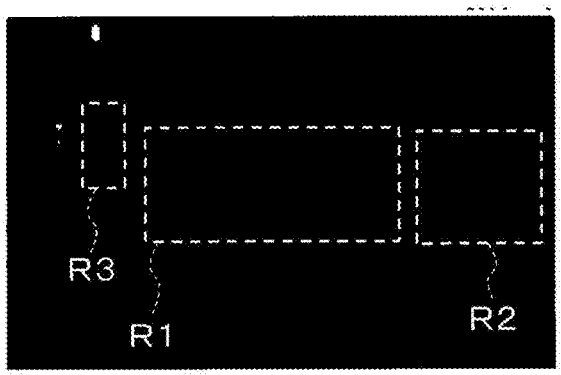
FIG. 17 illustrates a captured image of the wafer at a time subsequent to time t5 in FIG. 12.

Each of FIGS. 14 to 17 is a captured image of a top surface of the wafer 100 during the film formation process. FIG. 14 is an image captured at a time prior to time t3 in FIG. 12. FIG. 15 is an image captured at a time subsequent to time t3 and prior to time t4 in FIG. 12. FIG. 16 is an image captured at a time subsequent to time t4 and prior to time t5 in FIG. 12. FIG. 17 is an image captured at a time subsequent to time t5 in FIG. 12.

In each of FIGS. 14 to 17, the region R1 and the region R2 are a part of the first region 102, and the region R3 is a part of the second region 103. The white portion in the regions R1 and R2 in FIG. 14 is a portion of the wafer 100 where the trench 101 is formed. In FIG. 12, the solid line indicates an average of the gradation of the region R1, the one-dotted-chain line indicates an average of the gradation of the region R2, and the two-dotted-chain line indicates an average of the gradation of the region R3. In FIG. 13, the solid line indicates the difference between the gradation of the region R1 and the gradation of the region R3, and the one-dotted-chain line indicates the difference between the gradation of the region R2 and the gradation of the region R3.

During the film formation process, the temperature of the second region 103 is maintained constant. As a result, the gradation of the captured image of the second region 103 is substantially constant. The gradation of the captured image of the first region 102 varies along with the time as shown in FIG. 12.

At the stage immediately after the start of the film formation of the embedded layer 104 as shown in FIG. 14, the gradation of the first region 102 is substantially constant at a temperature higher than the gradation of the second region 103. As a result, the gradation difference between the first region 102 and the second region 103 is substantially constant at a value larger than a value indicated by the two-dotted-chain line in FIG. 13.

When the film formation as shown in FIGS. 15, 16 progresses, the gradation of the first region 102 decreases with the elapse of time. As a result, the gradation difference between the first region 102 and the second region 103 decreases with the elapse of time as shown in FIG. 13.

When the film formation further progresses and the trench 101 is completely embedded as shown in FIG. 17, the gradation of the first region 102 is constant at a value substantially equal to the gradation of the second region 103. As a result, the gradation difference between the first region 102 and the second region 103 is substantially constant at a value smaller than a value indicated by the two-dotted-chain line in FIG. 13.

When the value indicated by the two-dotted-chain line in FIG. 13 is set as a threshold value to be compared with the gradation difference, it is possible to detect the time of the end of the embedding of the trench 101 with enhanced precision. For example, it is possible to flatten the surface of the wafer 100 after the film formation and shorten the film formation time by ending the film formation process at a time when the difference between the gradation of each of the regions R1 and R2 and the gradation of the region R3 is smaller than or equal to the threshold value.

In the present embodiment, it is possible to attain the advantageous effects as similar to the effects in the first embodiment with the configuration and operation identical to the ones in the first embodiment.

According to the above embodiment, it is possible to attain the following advantageous effects.

When the embedding of the trench 101 ends, the gradation of the captured image of the first region 102 and the gradation of the captured image of the second region 103 are closer to each other. As comparing the gradation of the first region 102 with the gradation of the second region 103 as in the present embodiment, it is possible to detect the end of embedding quantitatively. In the present embodiment, when the difference between two detection results obtained by the image pickup device 57 is smaller than or equal to the threshold value, in other words, when the difference between the gradation of the captured image of the first region 102 and the gradation of the captured image of the second region 103 is smaller than or equal to the threshold value, the film formation process for the embedded layer 104 is ended. Therefore, it is possible to grasp the in-plane distribution of the embedded layer 104 and flatten the surface of the wafer 100 after the film formation, and it is possible shorten the film formation time.

Third Embodiment

The following describes a third embodiment. The present embodiment further includes the configuration of detecting the tilt of the wafer 100 and other parts identical to the ones in the first embodiment. The following only describes the parts different from the first embodiment.

Figure 18:
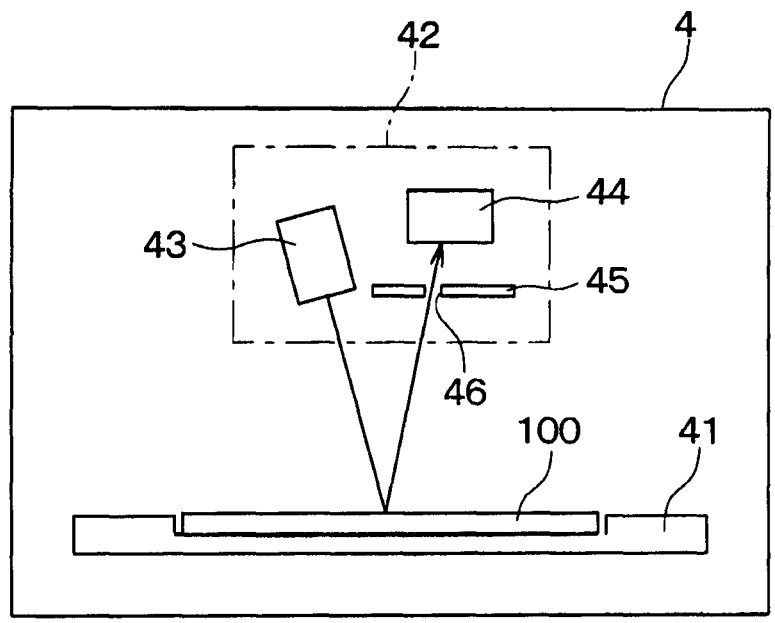
FIG. 18 illustrates the configuration of a susceptor chamber in a third embodiment.
Figure 19:
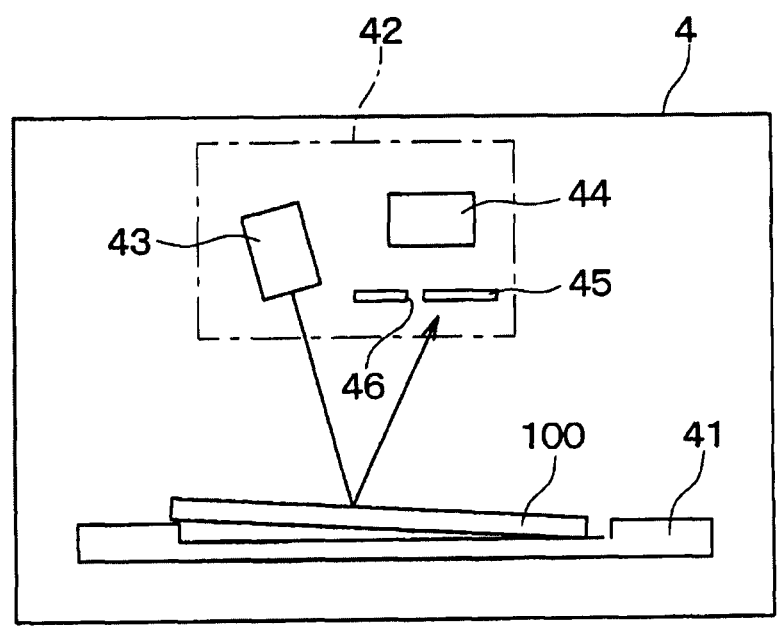
FIG. 19 illustrates a state in which the wafer is tilted with respect to a susceptor.

As illustrated in FIG. 18, the susceptor chamber 4 in the present embodiment includes a tilt detector 42. The tilt detector 42 detects the tilt of the wafer 100 with respect to the susceptor 41, and corresponds to a third detector. The tilt detector 42 includes a light source 43, a photodetector 44 and a shielding plate 45.

The light source 43 generates laser beam. The light source 43 is disposed to irradiate the generated laser beam on the wafer 100 above the susceptor 41. The light source 43 includes, for example, a semiconductor laser.

The photodetector 44 detects the laser beam, and is disposed so that the laser beam reflected by the wafer 100 is incident on the photodetector 44. The photodetector 44 includes, for example, a photodiode.

A shielding plate 45 is arranged between the photodetector 44 and the wafer 100. A slit 46 is formed at the shielding plate 45. The slit 46 is formed as follows. When the tilt of the wafer 100 with respect to the susceptor 41 is within a predetermined range, the reflected beam is incident on the photodetector 44 through the slit 46. When the tilt of the wafer 100 is not within the predetermined range, the reflected beam hits a position deviated from the slit 46, and is shielded by the shielding plate 45.

The light source 43 and the photodetector 44 are connected to the controller 6. The controller 6 operates the light source 43 to irradiate the laser beam on the wafer 100, and transports the susceptor 41 to the reactor 5 to start the film formation after confirming that the tilt of the wafer 100 with respect to the susceptor 41 is within the predetermined range based on the signal from the photodetector 44.

Figure 20:
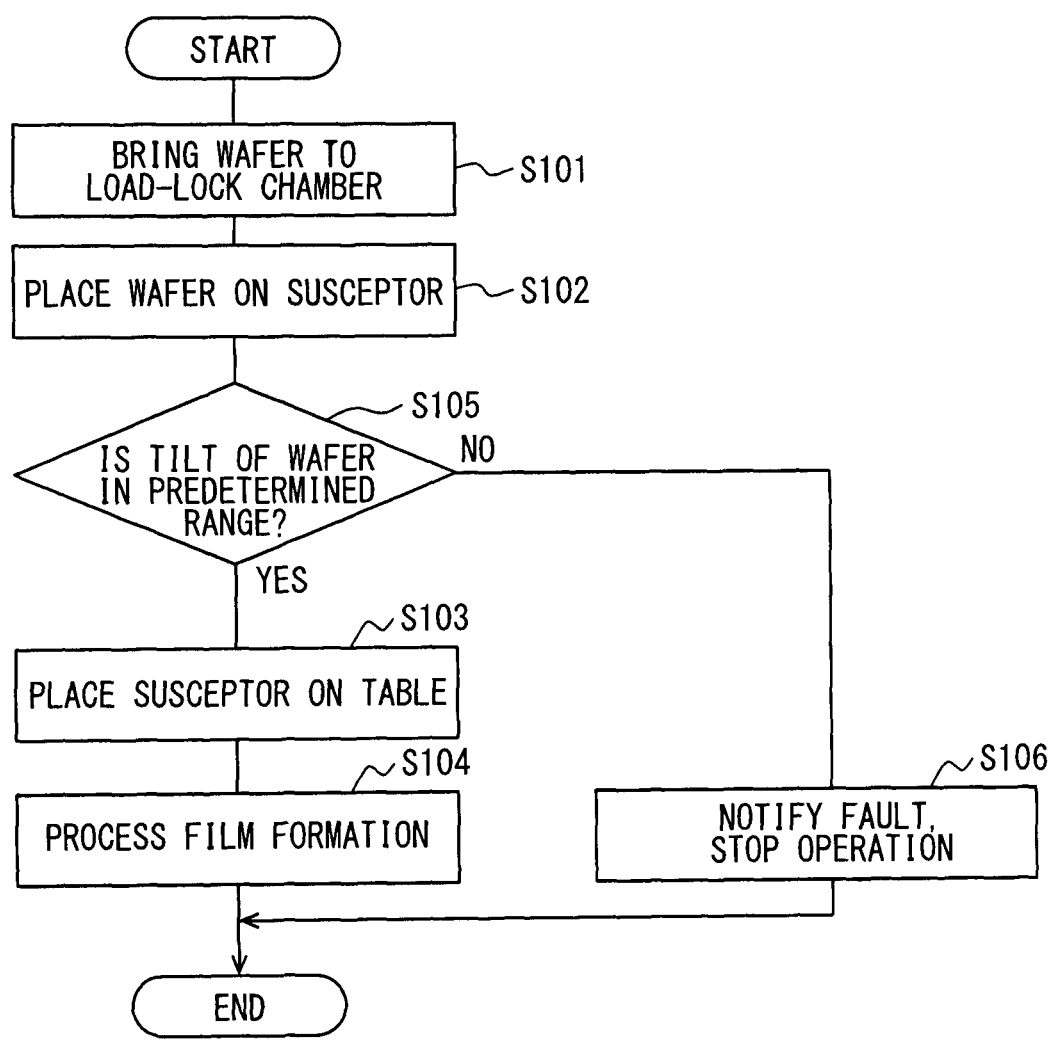
FIG. 20 illustrates a flowchart of manufacturing a semiconductor device in the third embodiment.

The following describes the operation of the manufacturing apparatus 1 according to the present embodiment. As illustrated in FIG. 20, in the present embodiment, the process is shifted from S102 to S105. In S105, the controller 6 determines whether the tilt of the wafer 100 with respect to the susceptor 41 is within the predetermined range.

The controller 6 operates the light source 43 to irradiate the laser beam on the wafer 100. When the photodetector 44 detects the reflected beam, the controller 6 determines that the tilt of the wafer 100 is within the predetermined range. When the photodetector 44 does not detect the reflected beam, the controller 6 determines that the tilt of the wafer 100 is out of the predetermined range.

When it is determined that the tilt of the wafer 100 is within the predetermined range, the process is shifted to S103 and the transport of the susceptor 41 is performed as similar to the first embodiment. The film formation is subsequently performed in subsequent S104. When it is determined that the tilt of the wafer 100 is not within the predetermined range, the process is shifted to S106, and the controller 6 operates a notification device (not shown) to notify of a fault, and stops the operation of, for example, the transporter 31. Subsequently, the process is ended without executing the film formation process.

In the present embodiment, it is possible to attain the advantageous effects as similar to the effects in the first embodiment with the configuration and operation identical to the ones in the first embodiment.

According to the above embodiment, it is possible to attain the following advantageous effects.

The film formation starts after confirming the tilt of the wafer 100 with respect to the susceptor 41 is within the predetermined range. Therefore, it is possible to prevent the film formation process from being executed while the wafer 100 is tilted, and it is possible to enhance the precision of detecting the end of embedding in the film formation process.

Fourth Embodiment

The following describes a fourth embodiment. The present embodiment further includes the configuration of detecting the tilt of the susceptor 41 and other parts identical to the ones in the third embodiment. The following only describes the part different from the third embodiment.

Figure 21:
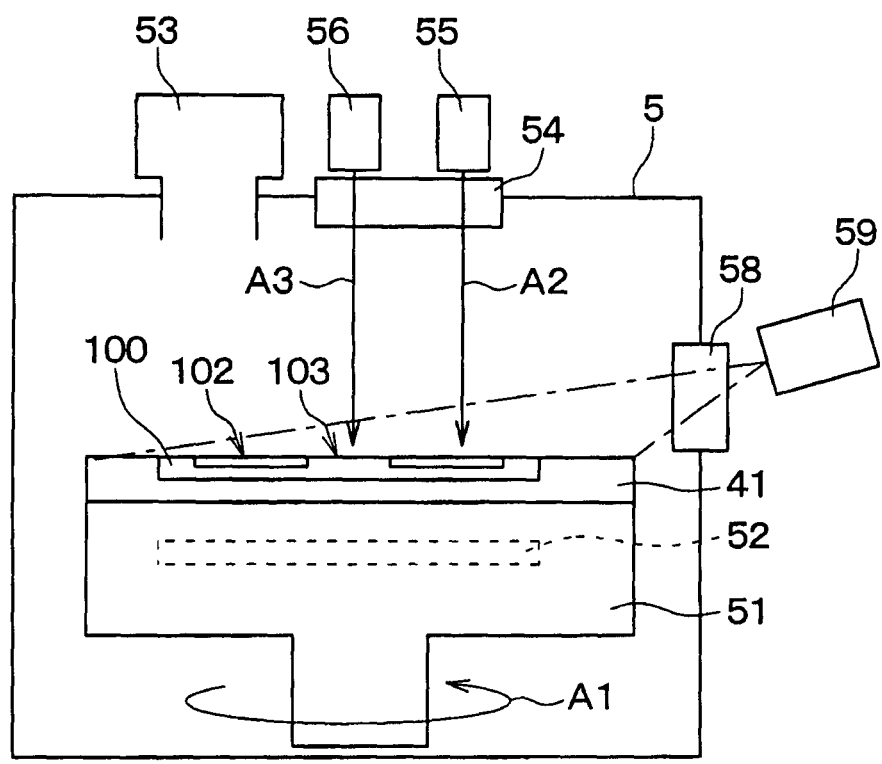
FIG. 21 illustrates the configuration of a reactor in a fourth embodiment.

As illustrated in FIG. 21, in the present embodiment, an opening is formed at the wall of the reactor 5, and the opening is closed by a quartz window 58. An image pickup device 59 is arranged outside of the reactor 5.

The image pickup device 59 detects the tilt of the susceptor 41 with respect to the table 51 when the susceptor 41 is placed at the table 51. The image pickup device 59 corresponds to a fourth detector. The result detected by the image pickup device 59 is transmitted to the controller 6. The controller 6 executes the film formation process, in a case where the tilt of the susceptor 41 detected by the image pickup device 59 is within the predetermined range.

Figure 22:
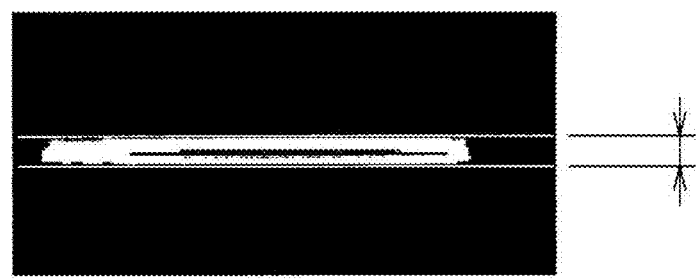
FIG. 22 illustrates a captured image of a susceptor.
Figure 23:
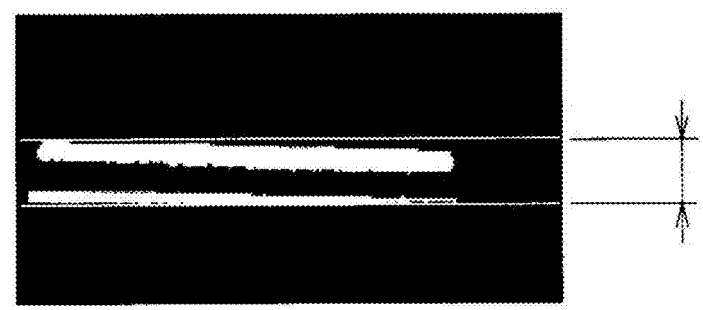
FIG. 23 illustrates the captured image of the susceptor when the susceptor is tilted with respect to a table.

The image pickup device 59 is arranged to capture an image of the top surface of the wafer 100 and the top surface of the susceptor 41 from the side of the susceptor 41 through the quartz window 58. In a case where the tilt of the susceptor 41 with respect to the table 51 is smaller, as illustrated in FIG. 22, the width of the top surface of the susceptor 41 in the image captured by the image pickup device 59 becomes smaller. In a case where the tilt of the susceptor 41 with respect to the table 51 is larger, as illustrated in FIG. 23, the width of the top surface of the susceptor 41 in the image captured by the image pickup device 59 becomes larger than the width in FIG. 22. The controller 6 determines whether the tilt of the susceptor 41 is within the predetermined range based on the width of the top surface of the susceptor 41.

The controller 6 binarizes the image transmitted from the image pickup device 59 with a predetermined gradation, and measures the width of the top surface of the susceptor 41 in a vertical direction, in other words, the distance between the end portion at the side farther from the image pickup device 59 and the end portion at the side near the image pickup device 59. In a case where the width of the top surface of the susceptor 41 measured from the binarized image is smaller than or equal to a threshold value, the controller 6 determines that the tilt of the susceptor 41 is within the predetermined range and executes the film formation process.

The image pickup device 59 captures an image of the susceptor 41 rotated along with the table 51. Therefore, it may be desirable to shorten the frame rate of the image pickup device 59 to some extent to reduce the blurring of the image captured by the image pickup device 59. For example, the frame rate of the image pickup device 59 may be set to be a quarter or less of the rotation period of the susceptor 41.

The image pickup device 59 captures an image of the susceptor 41 at a state where the temperature of the susceptor 41 is set at 800 degree Celsius or higher, for example, 1000 degree Celsius by the temperature adjuster 52. As a result, the difference between the gradation of the susceptor 41 and the surrounding object in the captured image becomes larger so that it is easier to distinguish the susceptor 41 from the other object.

Figure 24:
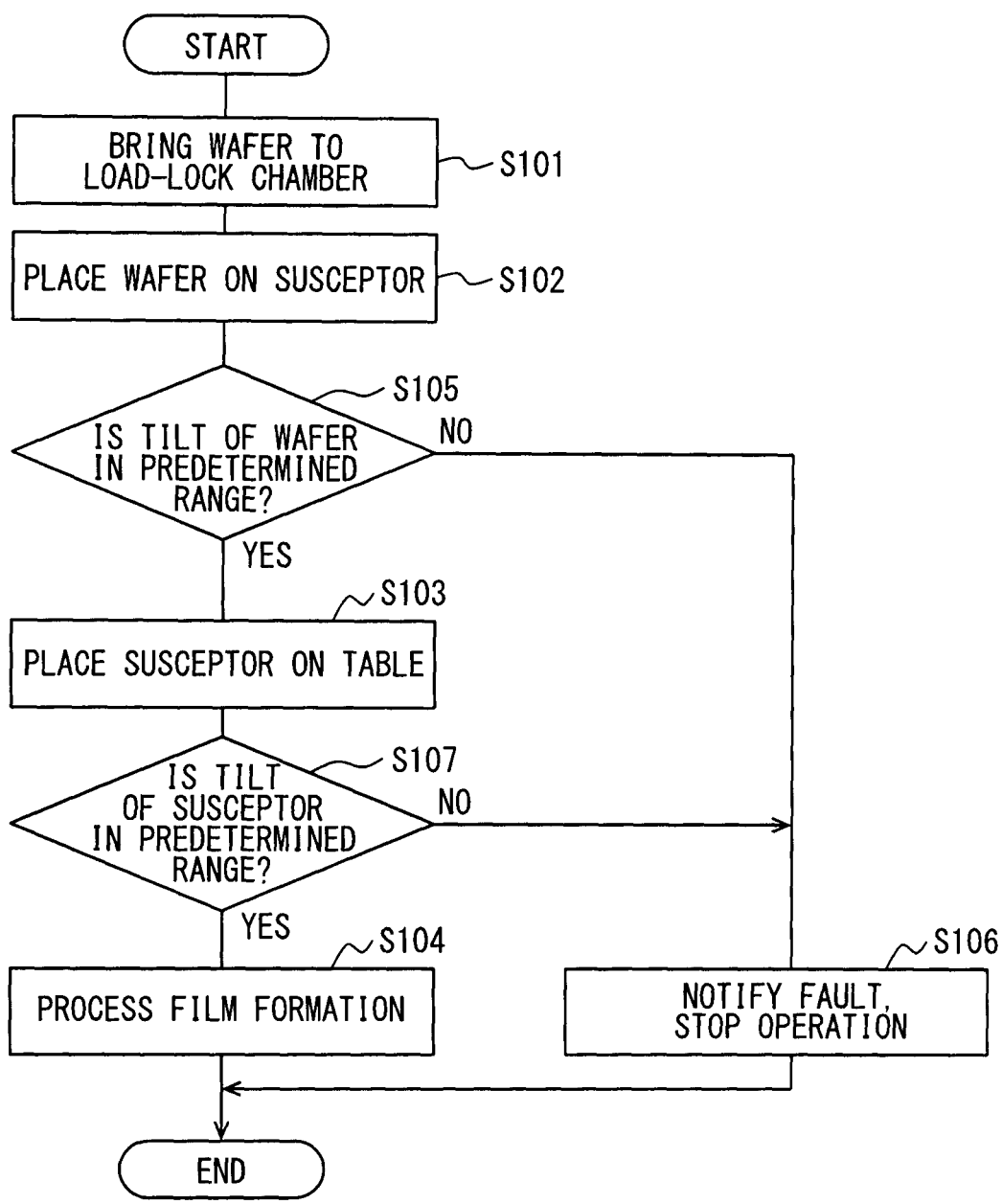
FIG. 24 illustrates a flowchart of manufacturing a semiconductor device in the fourth embodiment.

The following describes the operation of the manufacturing apparatus 1 according to the present embodiment. In the present embodiment, the process is shifted from S103 to S107 as illustrated in FIG. 24.

In S107, the controller 6 determines whether the tilt of the susceptor 41 with respect to the table 51 is within the predetermined range. In particular, the controller 6 operates the table 51 to rotate the susceptor 41 along with the table 51. The controller 6 operates the temperature adjuster 52 to set the temperature of the susceptor 41 at 800 degree Celsius or higher, based on the detection result of the temperature of the wafer 100 transmitted from the temperature detector 56.

The controller 6 operates the image pickup device 59 to capture an image of the susceptor 41 at a period of a quarter or less of the rotation period of the susceptor 41, and acquires the captured image to binarize the image with the predetermined gradation. The controller 6 measures the width of the top surface of the susceptor 41 in the binarized image. In a case where the measured width is smaller than or equal to the predetermined threshold value, the controller 6 determines that the tilt of the susceptor 41 with respect to the table 51 is within the predetermined range. In a case where the measured width is larger than the threshold value, the controller 6 determines that the tilt of the susceptor 41 with respect to the table 51 is not within the predetermined range.

When the tilt of the susceptor 41 is determined to be within the predetermined range, the process is shifted to S104, and the film formation process is executed as similar to the first embodiment. When it is determined that the tilt of the susceptor 41 is not within the predetermined range, the process is shifted to S106, and the controller 6 operates a notification device (not shown) to notify of a fault, and stops the operation of, for example, the transporter 31. Subsequently, the process is ended without executing the film formation process.

In the present embodiment, it is possible to attain the advantageous effects as similar to the effects in the first and third embodiments with the configuration and operation identical to the ones in the first and third embodiments.

According to the above embodiment, it is possible to attain the following advantageous effects.

The film formation starts after confirming the tilt of the susceptor 41 with respect to the table 51 is within the predetermined range. Therefore, it is possible to prevent the film formation process from being executed while the susceptor 41 is tilted, and it is possible to enhance the precision of detecting the end of embedding in the film formation process.

The image pickup device 59 captures an image of the susceptor 41 at a state where the susceptor 41 is set at 800 degree Celsius or higher. As a result, the difference between the gradation of the susceptor 41 and the surrounding object in the captured image becomes larger so that it is easier to distinguish the susceptor 41 from the other object.

The image pickup device 59 captures an image of the susceptor 41 at a period of a quarter or less of the rotation period of the susceptor 41. As a result, blurring of the image captured by the image pickup device 59 is reduced.

Other Embodiments

The present invention is not limited to the above embodiments, and can be appropriately modified within the scope described in the claims. The above-described embodiments are not independent of each other, and can be appropriately combined except when the combination is obviously impossible. In each of the above-described embodiments, individual elements or features of a particular embodiment are not necessarily essential unless it is specifically stated that the elements or the features are essential, or unless the elements or the features are obviously essential in principle. A quantity, a value, an amount, a range, or the like, if specified in the above-described example embodiments, is not necessarily limited to the specific value, amount, range, or the like unless it is specifically stated that the value, amount, range, or the like is necessarily the specific value, amount, range, or the like, or unless the value, amount, range, or the like is obviously necessary to be the specific value, amount, range, or the like in principle. Furthermore, a material, a shape, a positional relationship, or the like, if specified in the above-described example embodiments, is not necessarily limited to the specific shape, positional relationship, or the like unless it is specifically stated that the material, shape, positional relationship, or the like is necessarily the specific material, shape, positional relationship, or the like, or unless the shape, positional relationship, or the like is obviously necessary to be the specific shape, positional relationship, or the like in principle.

For example, the respective states of the first region 102 and the second region 103 are detected by temperature in the first embodiment, and the respective states of the first region 102 and the second region 103 are detected by the gradation of a captured image in the second embodiment. However, the respective states may also be detected by other methods. Even when the respective states of the first region 102 and the second region 103 are detected by other methods, it is possible to quantitatively detect the end of embedding by comparing the detection result of the first detector with the detection result of the second detector. By ending the film formation process when the difference of the detection results is smaller than or equal to the threshold value, it is possible to flatten the surface of the wafer 100 after embedding and shorten the film formation time.

In the first embodiment, the temperature difference between the first region 102 and the second region 103 is detected in a state where the temperature of the second region 103 is kept constant, and the temperature difference is compared with the threshold value. However, the temperature difference may also be detected in a state where the temperature of the second region 103 varies and compared with the threshold value.

In the third embodiment, the laser beam is used to detect the tilt of the wafer 100. However, the tilt of the wafer 100 may be detected by other methods. In the fourth embodiment, the tilt of the susceptor 41 is detected based on the width of the top surface of the susceptor 41 in the image captured by the image pickup device 59. However, the tilt of the susceptor 41 may also be detected based on other methods. The tilt may also be detected based on the area of the top surface instead of the width of the top surface.

In the second embodiment, the film formation may be started after confirming the tilt of the wafer 100 as in the third embodiment. In the second embodiment, the film formation may be started after confirming the tilt of the susceptor 41s in the fourth embodiment.

The controller and the technique according to the present disclosure may be achieved by a dedicated computer provided by constituting a processor and a memory programmed to execute one or more functions embodied by a computer program. Alternatively, the controller and the method described in the present disclosure may be implemented by a special purpose computer configured as a processor with one or more special purpose hardware logic circuits. Alternatively, the controller and the method described in the present disclosure may be implemented by one or more special purpose computer, which is configured as a combination of a processor and a memory, which are programmed to perform one or more functions, and a processor which is configured with one or more hardware logic circuits. The computer program may be stored, as instructions to be executed by a computer, in a tangible non-transitory computer-readable medium.

What is claimed is:

1. An apparatus for manufacturing a semiconductor device, the apparatus comprising:
   a film formation device configured to form an embedded layer for embedding a trench disposed at a substrate in the semiconductor device;
   a susceptor formed in a disk shape, the susceptor including a recess to hold the substrate, the recess having a center portion and a peripheral portion located outside of the center portion but within a radius of the recess;
   a first detector configured to detect a state of the peripheral portion of the recess to detect a state of a first region of the substrate during formation of the embedded layer, the first region being a region where the trench is disposed;
   a second detector configured to detect a state of the center portion of the recess to detect a state of a second region of the substrate during formation of the embedded layer, the second region being a region where the trench is not disposed, the second region disposed outside of the first region; and
   a controller configured to control a rotation of the susceptor, wherein:
   a rotational axis of the susceptor passes through a center of the recess, and
   the controller is further configured to end film formation of the embedded layer, based on a condition that a difference between a first detection result corresponding to the state of the first region and a second detection result corresponding to the state of the second region is smaller than or equal to a threshold value.

2. The apparatus according to claim 1,
wherein the first detector is further configured to detect a temperature of the first region as a first detected temperature,
wherein the second detector is further configured to detect a temperature of the second region as a second detected temperature, and
wherein the controller is configured to end film formation of the embedded layer, based on the condition that the difference between the first detected temperature, as the first detection result, and the second detected temperature, as the second detection result, is smaller than or equal to the threshold value.

3. The apparatus according to claim 2,
wherein the second region includes a central portion of the substrate.

4. The apparatus according to claim 1,
wherein the first detector includes an image sensor configured to capture an image of the first region as a first image, and
wherein the second detector includes an image sensor configured to capture an image of the second region as a second image.

5. The apparatus according to claim 4,
wherein the controller is configured to end film formation of the embedded layer, based on the condition that the difference between gradation of the first region in the first image, as the first detection result, and gradation of the second region in the second image, as the second detection result, is smaller than or equal to the threshold value.

6. The apparatus according to claim 1, further comprising:
a third detector configured to detect tilt of the substrate with respect to the susceptor holding the substrate,
wherein the film formation device is configured to form the embedded layer, based on a condition that the tilt of the substrate detected by the third detector is within a predetermined range.

7. The apparatus according to claim 1, further comprising:
a fourth detector configured to detect tilt of the susceptor with respect to a table on which the susceptor is placed,
wherein the film formation device is configured to form the embedded layer, based on a condition that the tilt of the susceptor is within a predetermined range.

8. The apparatus according to claim 7,
wherein the fourth detector is further configured to be placed at the table, and is configured to capture an image of the susceptor rotated along with the table, and
wherein the film formation device is configured to form the embedded layer, based on a condition that a width of a top surface of the susceptor measured based on the image is smaller than or equal to a threshold value.

9. The apparatus according to claim 8, further comprising:
a temperature adjuster configured to adjust a temperature of the susceptor,
wherein the fourth detector is further configured to capture the image of the susceptor in a period that is a quarter or less of a rotation period of the susceptor, based on a condition that the temperature of the susceptor is set at 800 degrees Celsius or higher by the temperature adjuster, and wherein the film formation device is configured to form the embedded layer, based on a condition that the width of the top surface of the susceptor is smaller than or equal to a threshold value in an image acquired by binarizing the image captured by the fourth detector with a predetermined gradation.

10. The apparatus according to claim 1,
wherein the substrate is formed as a wafer.

11. An apparatus for manufacturing a semiconductor device, the apparatus comprising:
a film formation device having an opening configured to receive a source gas to form an embedded layer for embedding a trench disposed at a substrate in the semiconductor device;
a susceptor formed in a disk shape, the susceptor including a recess to hold the substrate, the recess having a center portion and a peripheral portion located outside of the center portion but within a radius of the recess;
a first detector configured to detect a state of the peripheral portion of the recess to detect a state of a first region of the substrate during formation of the embedded layer, the first region being a region where the trench is disposed;
a second detector configured to detect a state of the center portion of the recess to detect a state of a second region of the substrate during formation of the embedded layer, the second region being a region where the trench is not disposed, the second region disposed outside of the first region; and
a controller configured to control a rotation of the susceptor, wherein:
a rotational axis of the susceptor passes through a center of the recess, and
the controller is further configured to end film formation of the embedded layer, based on a condition that a difference between a first detection result corresponding to the state of the first region and a second detection result corresponding to the state of the second region is smaller than or equal to a threshold value.

12. The apparatus according to claim 11,
wherein the first detector is further configured to detect a temperature of the first region as a first detected temperature,
wherein the second detector is further configured to detect a temperature of the second region as a second detected temperature, and
wherein controller is configured to end film formation of the embedded layer, based on the condition that the difference between the first detected temperature, as the first detection result, and the second detected temperature, as the second detection result, is smaller than or equal to the threshold value.

13. The apparatus according to claim 12,
wherein the second region includes a central portion of the substrate.

14. The apparatus according to claim 11,
wherein the first detector includes an image sensor configured to capture an image of the first region as a first image, and
wherein the second detector includes an image sensor configured to capture an image of the second region as a second image.

15. The apparatus according to claim 14,
wherein the controller is configured to end film formation of the embedded layer, based on the condition that the difference between gradation of the first region in the first image, as the first detection result, and gradation of the second region in the second image, as the second detection result, is smaller than or equal to the threshold value.

16. The apparatus according to claim 11, further comprising:

a third detector configured to detect tilt of the substrate with respect to the susceptor holding the substrate,
wherein the film formation device is configured to form the embedded layer, based on a condition that the tilt of the substrate detected by the third detector is within a predetermined range.

17. The apparatus according to claim 11, further comprising:
a fourth detector configured to detect tilt of the susceptor with respect to a table on which the susceptor is placed,
wherein the film formation device is configured to form the embedded layer, based on a condition that the tilt of the susceptor is within a predetermined range.

18. The apparatus according to claim 17,
wherein the fourth detector is further configured to be placed at the table, and is configured to capture an image of the susceptor rotated along with the table, and
wherein the film formation device is configured to form the embedded layer, based on a condition that a width of a top surface of the susceptor measured based on the image is smaller than or equal to a threshold value.

19. The apparatus according to claim 18, further comprising: a temperature adjuster configured to adjust a temperature of the susceptor,
wherein the fourth detector is further configured to capture the image of the susceptor in a period that is a quarter or less of a rotation period of the susceptor, based on a condition that the temperature of the susceptor is set at 800 degrees Celsius or higher by the temperature adjuster, and
wherein the film formation device is configured to form the embedded layer, based on a condition that the width of the top surface of the susceptor is smaller than or equal to a threshold value in an image acquired by binarizing the image captured by the fourth detector with a predetermined gradation.

20. The apparatus according to claim 1, wherein the substrate is formed as a wafer.

21. An apparatus for manufacturing a semiconductor device, the apparatus comprising:
a film formation device configured to form an embedded layer for embedding a trench disposed at a substrate in the semiconductor device;
a susceptor formed in a disk shape, the susceptor including a recess to hold the substrate, the recess having a center portion and a peripheral portion located outside of the center portion but within a radius of the recess;
a first temperature detector configured to detect a temperature of the peripheral portion of the recess to detect a temperature of a first region of the substrate, the first region being a region
where the trench is disposed;
a second temperature detector configured to detect a temperature of the center portion of the recess to detect a temperature of a second region of the substrate, the second region being a region where the trench is not disposed;
an image pickup device configured to capture an image of the peripheral region as a first image and an image of the center region as a second image, and based on a gradation of the peripheral region seen in the first image and a gradation of the center region seen in the second image, detect the state of the first region and the state of the second region; and
a controller configured to control a rotation of the susceptor, wherein:
a rotational axis of the susceptor passes through a center of the recess, and
the controller is configured to end film formation of the embedded layer, based on a condition that a difference between a first detection result corresponding to the temperature of the peripheral region of the recess and a second detection result corresponding to the temperature of the center portion of the recess is smaller than or equal to a threshold value.

22. The apparatus according to claim 1, wherein the recess of the susceptor is only a single recess.

* * * * *